United States Patent [19]

Welland

[11] Patent Number: 5,451,901
[45] Date of Patent: Sep. 19, 1995

[54] TRANSCONDUCTANCE AMPLIFIERS AND EXPONENTIAL VARIABLE GAIN AMPLIFIERS USING THE SAME

[75] Inventor: David R. Welland, Austin, Tex.

[73] Assignee: Cirrus Logic Inc., Fremont, Calif.

[21] Appl. No.: 270,126

[22] Filed: Jul. 1, 1994

[51] Int. Cl.⁶ .......................... H03F 3/45; H03B 3/30
[52] U.S. Cl. .............................. 330/133; 330/134; 330/253; 330/254; 330/279; 330/284; 330/260
[58] Field of Search ............... 330/133, 134, 144, 145, 330/253, 254, 279, 260, 282, 283, 284

[56] References Cited

U.S. PATENT DOCUMENTS

| | | | |
|---|---|---|---|
| 4,459,555 | 7/1984 | Jett, Jr. ................ | 330/284 X |
| 4,471,324 | 9/1984 | Welland ................ | 330/284 X |
| 4,518,870 | 5/1985 | Banu ..................... | 330/253 X |
| 5,142,242 | 8/1992 | Schaffer ............... | 330/253 |
| 5,198,780 | 3/1993 | Kase ..................... | 330/254 |

*Primary Examiner*—James B. Mullins
*Attorney, Agent, or Firm*—Blakely, Sokoloff, Taylor & Zafman

[57] ABSTRACT

Transconductance amplifiers having high speed, a wide output voltage swing, good linearity and expandability are disclosed. All active devices are n-channel MOSFET devices with the output current of the amplifiers being provided by devices with their sources tied to ground. Connection of one of the MOSFET transconductance amplifiers to a MOSFET load device and appropriate control of the MOSFET resistance devices in the transconductance amplifier and the load circuit provides a variable gain amplifier having a good estimation of an exponential response to the gain control signal, thus being suitable for use in closed loop automatic gain control circuits.

24 Claims, 6 Drawing Sheets

TRANSCONDUCTANCE AMPLIFIERS AND EXPONENTIAL VARIABLE GAIN AMPLIFIERS USING THE SAME

BACKGROUND OF THE INVENTION

1. Field of the Invention

The present invention relates to the field of MOSFET transconductance amplifiers, and automatic gain control circuits using MOSFET amplifiers.

2. Prior Art

Various transconductance amplifier circuits are well known in the prior art. Those disclosed herein, however, have various advantages in that they are realized in CMOS, have all n-channel active devices providing the amplification for faster response, have a wide output voltage swing, provide good linearity, and have expandability through additional current mirroring of the output.

In addition, automatic gain control circuits are also well known. In an automatic gain control circuit, as illustrated in FIG. 1, it is desirable to provide a constant change in the amplitude y of the signal y with a change in the gain control voltage $V_c$, independent of the amplitude x of the input signal x. Since the gain G is the only variable element in the automatic gain control loop, this fixes the time response (dynamics) of the automatic gain control loop independent of the amplitude of the input signal, making loop stabilization easier and providing repeatable automatic gain control performance independent of the average input signal amplitude (within the automatic gain control range). In equation form, this provides:

$$G = f(V_c)$$

(Gain is a function of the gain control voltage $V_c$)

$$y = G*x = f(V_c)*x$$

If the change in the amplitude y of the signal y with a change in the gain control voltage $V_c$ is to be independent of the amplitude x of the input signal x, then:

$$\frac{\partial y}{\partial V_c} = \frac{\partial}{\partial V_c}[f(V_c)*x] = \frac{df(V_c)}{dV_c}*x + f(V_c)\frac{\partial x}{\partial V_c}$$

Note that x is independent of $V_c$, so that:

$$f(V_c)\frac{\partial x}{\partial V_c} = 0$$

Solving for the desired variation of G with $V_c$:

$$\frac{df(V_c)}{dV_c}*x = k$$

$$\frac{df(V_c)}{dV_c} = \frac{k}{x}$$

where: k = a constant
Since y = G*x, and G = f($V_c$):

$$\frac{df(V_c)}{dV_c} = \frac{dG}{dV_c},$$

and $$\frac{k}{x} = \frac{k*G}{y},$$

or $$\frac{dG}{dV_c} = \frac{k*G}{y}$$

Assuming y is at least approximately equal to the reference voltage $V_{ref}$:

$$\frac{dG}{dV_c} = \frac{k*G}{V_{ref}},$$

or $$G = Ce^{\frac{k*V_c}{V_{ref}}} = Ce^{k'V_c}$$

where: C = an arbitrary constant, and
k' = k/$V_{ref}$

Thus in an automatic gain control circuit, it is commonly desired to have a variable gain amplifier having an exponential variation in gain with respect to the gain control signal $V_c$. Bipolar devices have a good exponential characteristic, and therefore bipolar automatic gain control circuits are commonly used. CMOS devices, however, do not have a good exponential characteristic, and therefore the realization of an automatic gain control circuit with the desired gain control response in CMOS is a much more difficult problem. The present invention transconductance amplifiers in conjunction with active CMOS load devices well approximate the desired gain control response while maintaining the advantages of the present invention transconductance amplifiers hereinbefore set forth.

BRIEF SUMMARY OF THE INVENTION

Transconductance amplifiers having high speed, a wide output voltage swing, good linearity and expandability are disclosed. All active devices are n-channel MOSFET devices with the output current of the amplifiers being provided by devices with their sources tied to ground. Connection of one of the MOSFET transconductance amplifiers to a MOSFET load device and appropriate control of the MOSFET resistance devices in the transconductance amplifier and the load circuit provides a variable gain amplifier having a good estimation of an exponential response to the gain control signal, thus being suitable for use in closed loop automatic gain control circuits.

DETAILED DESCRIPTION OF THE INVENTION

Figure 2:
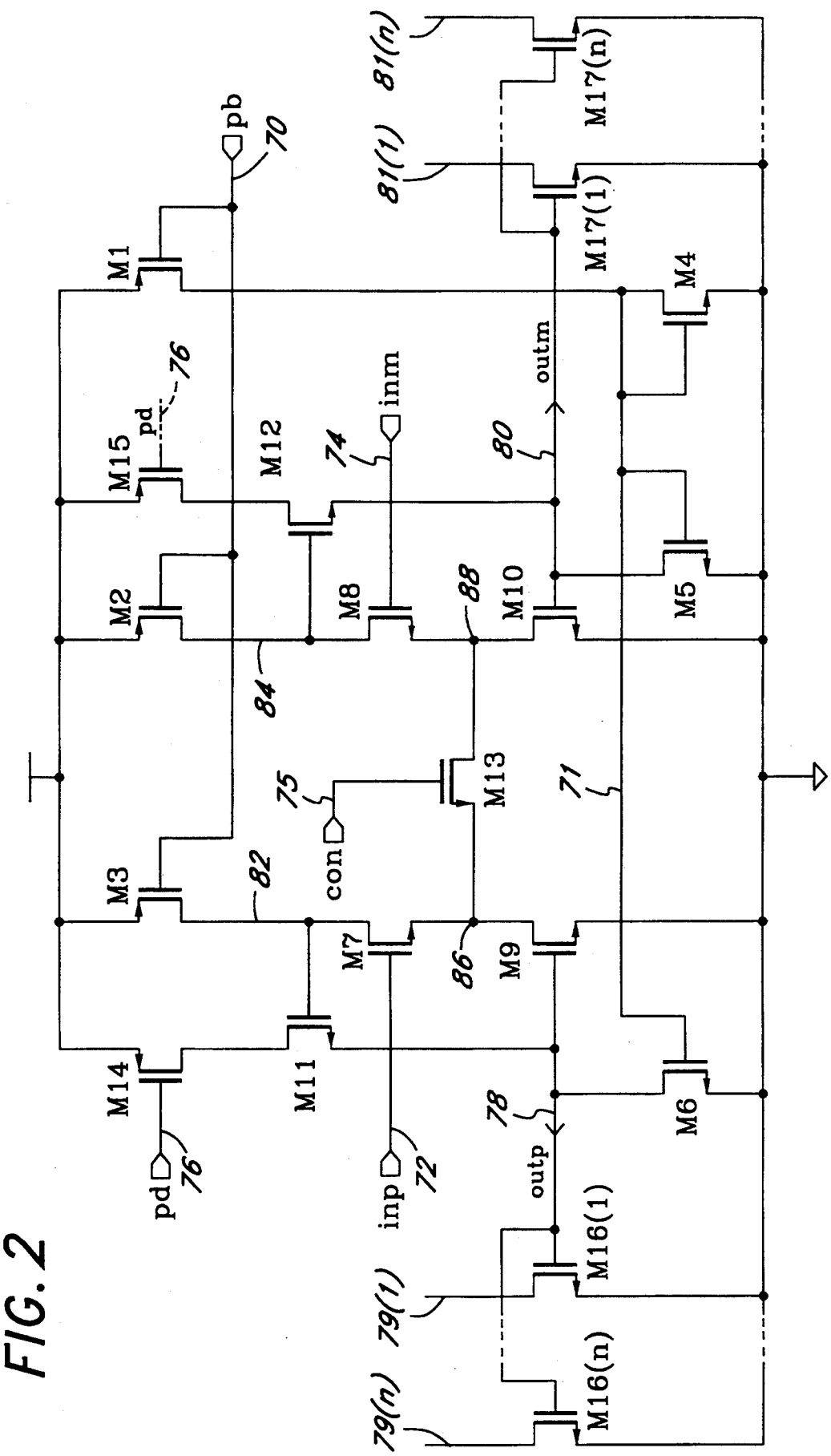
FIG. 2 is a circuit diagram for the preferred embodiment transconductance amplifier of the present invention.
Figure 3:
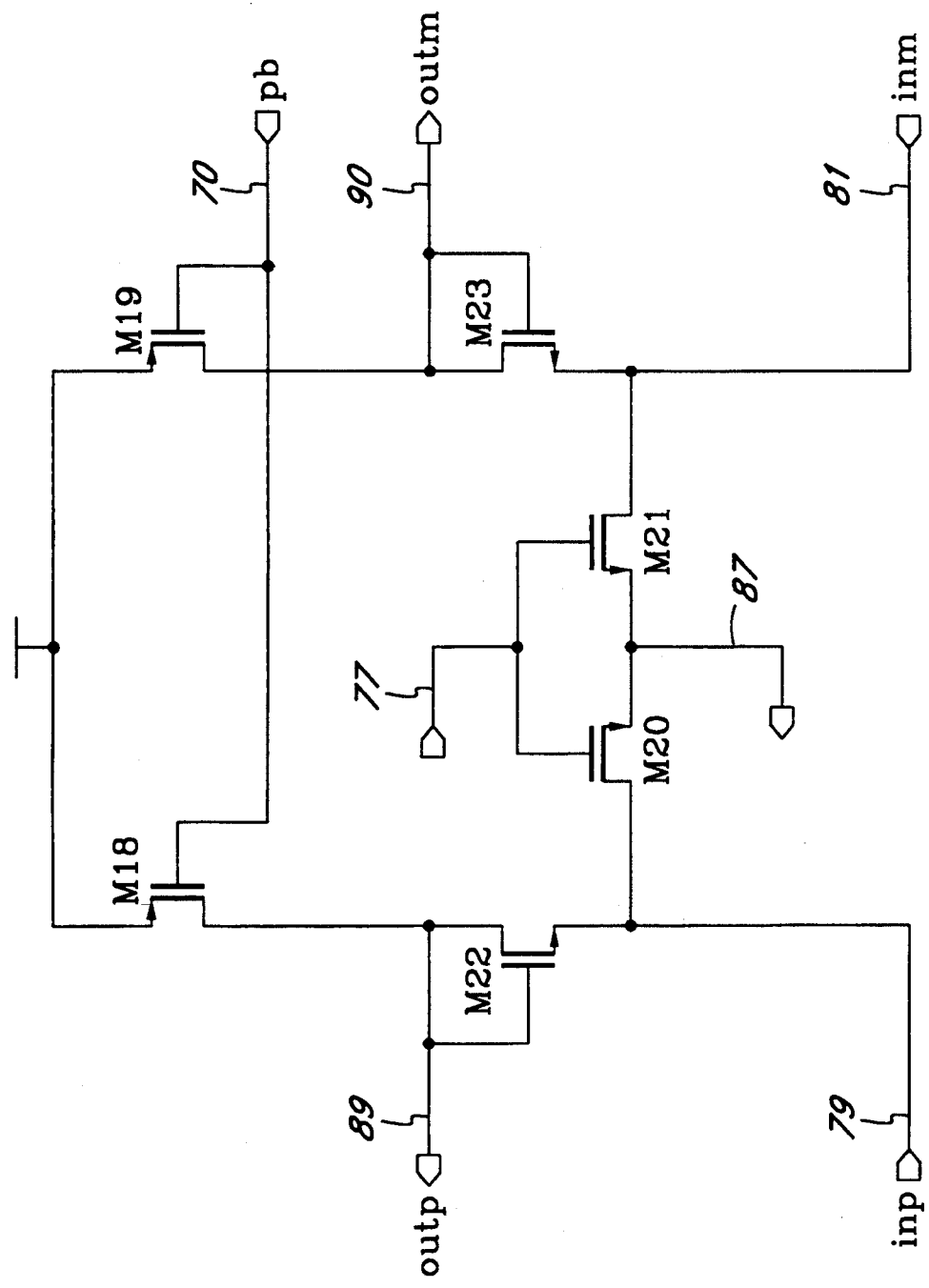
FIG. 3 is a circuit diagram for the preferred embodiment resistance circuit of the present invention.

Circuit diagrams for a preferred embodiment transconductance amplifier and a representative resistance or load stage, respectively, may be seen in FIGS. 2 and 3. Referring first to FIG. 2, the voltage on line 70 is set from a current mirror in a bias circuit (not shown) to establish the desired constant current levels in devices M1, M2 and M3 by setting the gate-source voltage of these three devices, the currents particularly in devices M2 and M3 being equal. The current in device M4, being in series with device M1, is equal thereto, with device M4 mirroring the current there through to devices M5 and M6 by the common gate connections on line 71, the current in devices M5 and M6 being equal (M5 and M6, like M2 and M3, being identical devices). The differential input voltage is applied through lines 72 and 74 to the gates of devices M7 and M8, respectively. Since the gates of devices M11 and M12 require essentially no current, the current in M7 is the same as the current in M3, which in turn is equal to the current in device M2 and device M8. This in turn provides that the gate-source voltage of devices M7 and M8 are constant and equal, independent of the differential voltage applied to lines 72 and 74 (and neglecting any possible back gate effects, which are well understood and therefore will not be further described herein). It is this constant gate-source voltage on devices M7 and M8 that provides the linearity of the transconductance amplifier.

Device M13 has its gate connected to a reference voltage 75 set so that device M13 acts as a resistor of appropriate value. Since device M13 is connected between the sources of devices M7 and M8, the voltage across device M13 at any time will be equal to the differential voltage across lines 72 and 74, and accordingly the current through device M13 will be proportional to the differential voltage input on lines 72 and 74.

Devices M14 and M15 act as switches, and have their gates connected to a power down signal pd on line 76 for controllably turning the circuit on and off to conserve power when the system or subsystem in which the circuit is used need not be active all the time. When on, devices M14 and M15 effectively connect the drains of devices M11 and M12, respectively, to the positive voltage supply.

When the input voltages on lines 72 and 74 are equal (zero differential input), there will be no voltage across device M13 and accordingly no current there through. In this condition, devices M3, M7, M9, M2, M8 and M10 all have the same magnitude of current there through. Similarly, devices M14, M11, M6, M15, M12 and M5 all have the same magnitude of current there through. The voltages on lines 78 and 80 are equal to each other and to the gate-source voltage of devices M9 and M10 for the magnitude of current there through. The voltages on lines 78 and 80 are connected to the gates of multiple devices M16 and M17, thereby mirroring the current through devices M9 and M10 of FIG. 2 to the multiple outputs 79 and 81 of multiple devices M16 and M17, respectively.

Assume that the voltage on line 72 now increases and the voltage on line 74 decreases by the same amount. The immediate effect is to turn device M7 on harder and to turn device M8 off somewhat. Since the currents in devices M2 and M3 do not change, the voltage of node 82 will drop because of device M7 now conducting more than device M3, and similarly the voltage of node 84 will increase because of device M8 now conducting less than device M2. The decrease in voltage of node 82 reduces the gate-source voltage of device M11, thereby reducing the current there through, with the constant current through device M6 pulling the gate of device M9 lower, thereby tending to reduce the current flow through device M9. As a result of device M7 being turned on harder, and particularly device M9 being turned off somewhat, the voltage of node 86 will increase, and similarly the voltage of node 88 will decrease by the same amount. The circuit will stabilize when the gate-source voltage of device M7 and device M8 are equal and appropriate to conduct the same amount of current, namely the current through current source devices M3 and M2. Because of the voltage now appearing across device M13, the same will conduct a current proportional thereto, so that the current through device M9 will be reduced and the current through M10 will be increased from the quiescent values thereof. Thus, the voltages on lines 78 and 80 will adjust accordingly to set the gate-source voltages of devices M9 and M10 as required for the now unequal currents there through. This mirrors the unequal currents through devices M9 and M10 to the multiple outputs 79 and 81 of multiple devices M16 and M17, respectively. For a fixed differential input voltage across lines 72 and 74, nodes 82 and 84 will settle at a voltage which sets the gate-source voltages of devices M11 and M12 so that the two have the same current there through, namely, the current through devices M5 and M6. The circuit is stable, and because all devices in the signal path are n-channel devices, the circuit is very fast, providing a high frequency response between the input voltages on lines 72 and 74 and the output currents through multiple devices M16 and M17.

Referring again to FIG. 2, it will be noted that n pairs of devices M16 and M17 are shown. In some applications, only one pair of output current devices will be needed, though in other applications, multiple differential output current pairs may be desired to drive other circuits, each in some relative proportion to the first output of the transconductance amplifier. This expandability by additional pairs of devices M16 and M17, ratioed in size as desired, provides great flexibility in application of the invention.

Referring now to FIG. 3, devices M18 and M19 are also connected through lines 70 to a reference voltage so as to be biased to act as current sources. Similarly, devices M20 and M21 have their gates connected to an appropriate bias on line 77 to bias the same as resistors, with a common mode sense connection on line 87 providing a common mode voltage level sensing node for feedback to circuitry (not shown because such circuitry is well known) for controlling the common mode voltage levels of the system. Finally, devices M22 and M23 have their gates and drains connected together, with the differential outputs on lines 89 and 90 being taken from the drain-gate connections of the respective devices. In operation, the difference in currents between devices M16 and M17 on lines 79 and 81, respectively, of FIG. 2 becomes the current through devices M20 and M21 of FIG. 3. Because the currents through devices M22 and M23 are equal, the gate-source voltage of these devices are also equal, so that the differential voltage across devices M20 and M21 is reflected by the devices M22 and M23 as the differential output voltage on lines 89 and 90.

The resistance presented by devices M20 and M21 and the apparent resistance of the circuit is approximately inversely proportional to the amount the voltage on line 77 exceeds the threshold of devices M20 and M21. Thus, the circuit transfer function of $V_o/I_{in}$ is approximately inversely proportional to the amount the voltage on line 77 exceeds the threshold of devices M20 and M21.

Figure 1:
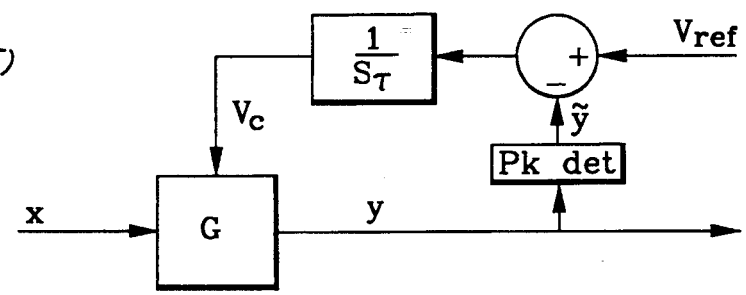
FIG. 1 is a block diagram of a typical automatic gain control loop.
Figure 4:
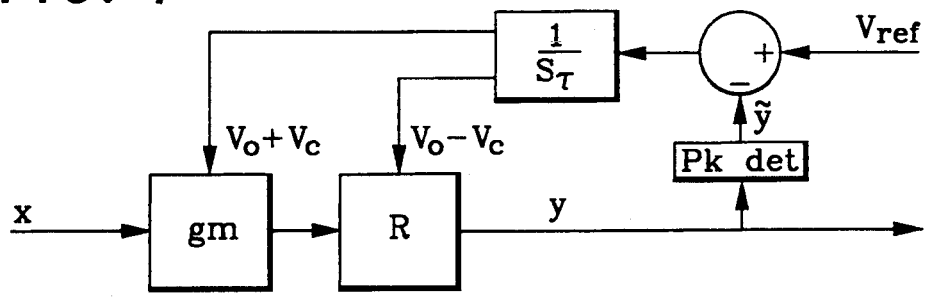
FIG. 4 illustrates the transconductance amplifier of FIG. 2 and the load circuit of FIG. 3 used to realize a CMOS variable gain amplifier suitable for use in an automatic gain control circuit.

The transconductance amplifier of FIG. 2 and the load circuit of FIG. 3 can advantageously be used to realize a CMOS variable gain amplifier suitable for use in an automatic gain control circuit as shown on FIG. 4. In particular, referring again to FIG. 2, the voltage on line 75 sets the resistance of device M13. This determines the current through device M13 for a given differential voltage between nodes 86 and 88, which current determines the differential current output of the amplifier in any of the pairs of output devices M16 and M17. Thus the voltage on line 75 determines the transconductance of the amplifier as follows:

$$gm = K_o * V_{ong}$$

where: $K_o$ is a constant $V_{ong}$ is the voltage on line 75 turning on device M13 of the gm stage, as measured from the threshold of the device Similarly, referring to FIG. 3, the voltage on line 77 sets the conductance (1/resistance) of devices M20 and M21. This determines the voltage across the devices for a given current there through, which current is the differential current mirrored via the voltages on lines 78 and 80 to devices M16 and M17, respectively. Thus the voltage on line 77 determines the resistance of the resistance stage as follows:

$$R = \frac{1}{K_r V_{onr}}$$

where: R is the effective resistance of the resistance stage of FIG. 3

$K_r$ is a constant $V_{onr}$ is the voltage on line 77 turning on devices M20 and M21 of the resistance stage, as measured from the threshold of the devices The gain of the combination of the transconductance stage and the resistance stage is:

$$G = gm * R = \frac{V_{ong} K_o}{V_{onr} K_r}$$

In accordance with the preferred embodiment of the present invention, the gain G is controlled by controlling the voltages $V_{ong}$ and $V_{onr}$ in a particular way, specifically substantially linearly but in opposite directions around an intermediate voltage. In equation form:

$$V_{ong} = V_o + V_c$$

where $V_o$ is the intermediate or midpoint voltage $V_c$ is an incremental change to the intermediate or midpoint voltage $V_o$ for gain control purposes Since the gain G is controlled by controlling the voltages $V_{ong}$ and $V_{onr}$ linearly but in opposite directions around the voltage $V_o$:

$$V_{onr} = V_o - V_c$$

This control is illustrated in FIG. 4, wherein the transfer function $1/S\tau$ is realized by a current source in the AGC feedback loop controlled by the summing point and a capacitor coupled to ground.

Therefore, expanding the fraction:

$$G = \frac{K_o}{K_r} \frac{V_{ong}}{V_{onr}} = \frac{K_o}{K_r} \frac{V_o + V_c}{V_o - V_c} =$$

$$\frac{K_o}{K_r} \left( 1 + \frac{2V_c}{V_o} + 2 \left( \frac{V_c}{V_o} \right)^2 + 2 \left( \frac{V_c}{V_o} \right)^3 + \ldots \right)$$

The desired gain characteristic for automatic gain control circuits was previously given as:

$$G = Ce^{\frac{k*V_c}{V_{ref}}} = Ce^{k'V_c}$$

where:

$$k' = \frac{k}{V_{ref}}$$

With $k' = 2/V_o$, and setting the arbitrary constant C to be $K_o/K_r$, this becomes:

$$G = \frac{K_o}{K_r} e^{\frac{2V_c}{V_o}}$$

Expanding the same using a Taylor expansion:

$$G = \frac{K_o}{K_r} e^{\frac{2V_c}{V_o}} =$$

$$\frac{K_o}{K_r} \left( 1 + \frac{2V_c}{V_o} + 2 \left( \frac{V_c}{V_o} \right)^2 + \frac{4}{3} \left( \frac{V_c}{V_o} \right)^3 + \ldots \right)$$

Figure 5:
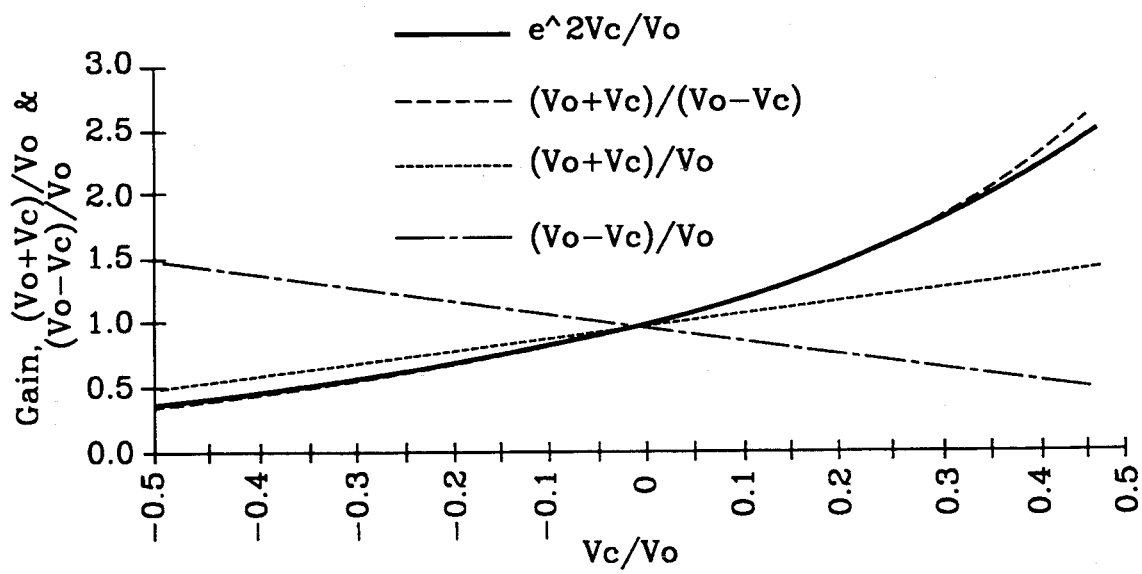
FIG. 5 is a plot showing normalized gain control voltages and gain as a function of $V_c/V_o$.

Thus it may be seen that controlling the gain G of the combination of a gm stage and a resistance stage by controlling the voltages $V_{ong}$ and $V_{onr}$ linearly but in opposite directions around the voltage $V_o$, the resulting gain closely follows the desired exponential variation of gain with the control voltage $V_c$ over the operating range of the variable gain amplifier, deviating only in the third (and higher) orders of the expansion of the respective gain responses. By way of example, if $V_c$ ranges to $\pm 0.5 \, V_o$, then the gain can be controlled over a range of 9 to 1, yet the maximum deviation of the actual gain from the ideal characteristic will only be about 10%. This is illustrated below and shown graphically in FIG. 5.

$$G = \frac{K_o}{K_r} \frac{V_o + V_c}{V_o - V_c} = \frac{K_o}{K_r} \frac{1 + 0.5}{1 - 0.5} = 3 \frac{K_o}{K_r},$$

versus $$G = \frac{K_o}{K_r} \frac{V_o + V_c}{V_o - V_c} = \frac{K_o}{K_r} \frac{1 - 0.5}{1 + 0.5} =$$

$$\frac{1}{3} \frac{K_o}{K_r} = 9 \text{ to } 1 \text{ gain range,}$$

and $$G = \frac{K_o}{K_r} e^{\frac{2V_c}{V_o}} = \frac{K_o}{K_r} e^1 = 2.718 \frac{K_o}{K_r}$$

$$G = \frac{K_o}{K_r} e^{\frac{2V_c}{V_o}} = \frac{K_o}{K_r} e^{-1} = 0.368 \frac{K_o}{K_r}$$

3/2,718=1.1 at the exemplary upper gain limit
1/(3)(0.368)=0.91 at the exemplary lower gain limit A narrower range of the control voltage $V_c$ would provide a substantially smaller deviation from the exponential characteristic, and in any event, cascading of successive gm and R stages allows great increases in the gain control range attainable, as n successive gm and R stages provides a gain range of $G^n$, where G is the operating gain variation allowable in each individual such stages.

Figure 6:
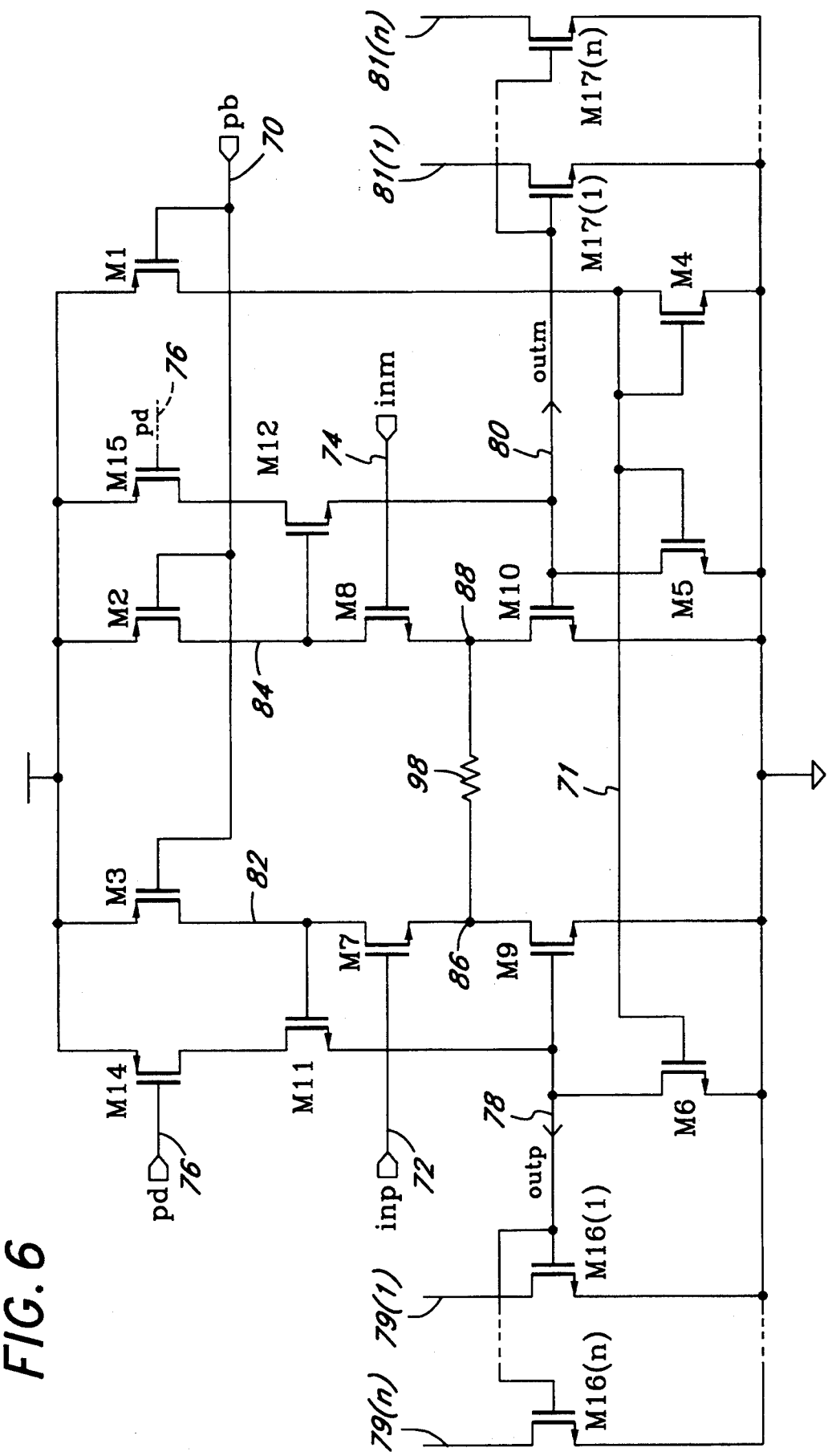
FIG. 6 is a circuit diagram similar to FIG. 2 showing an alternate embodiment transconductance amplifier having a transconductance set by a fixed resistor.
Figure 7:
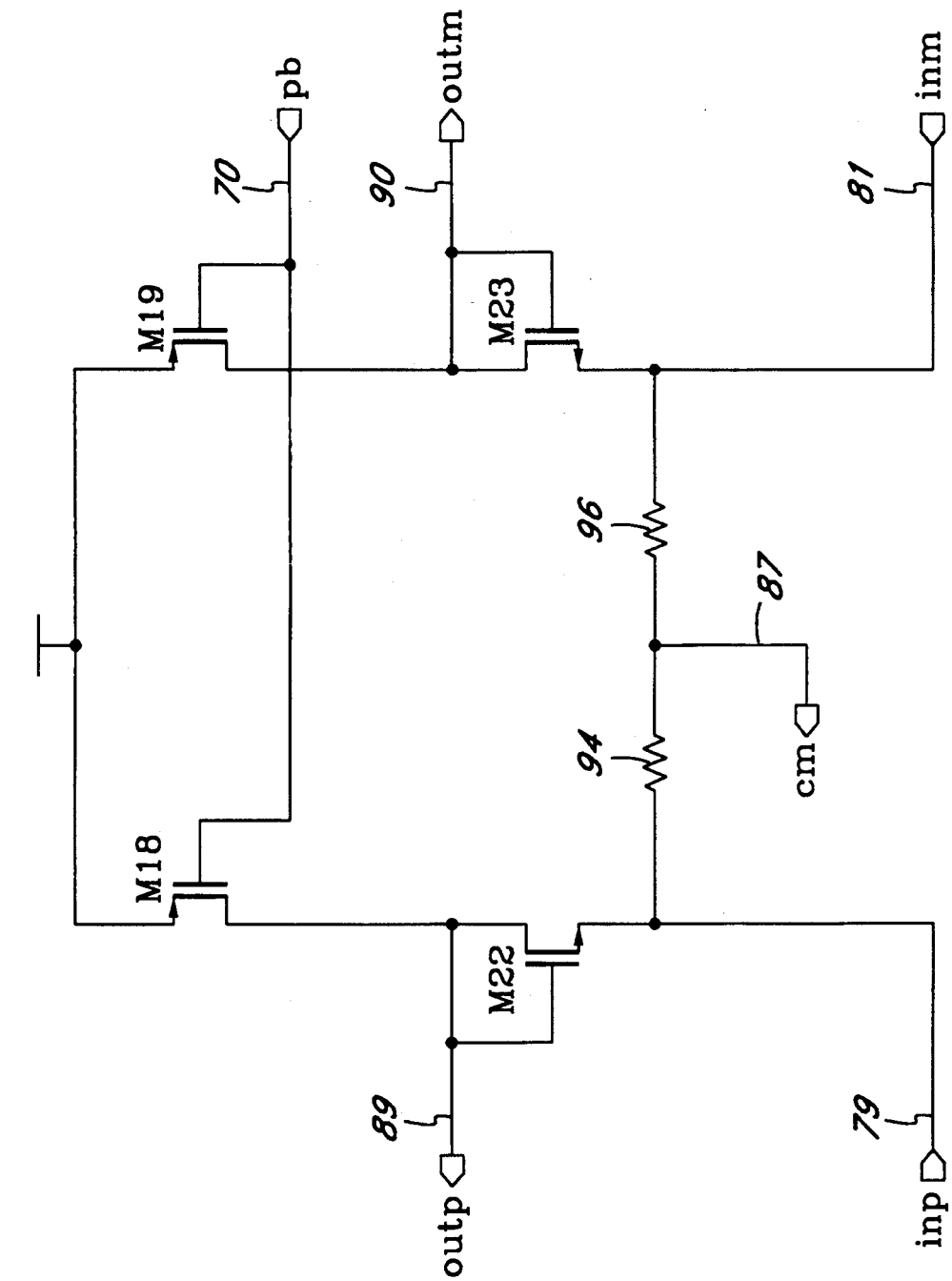
FIG. 7 is a circuit diagram similar to FIG. 3 showing an alternate embodiment resistance circuit of the present invention using a pair of fixed resistors.

Referring now to FIGS. 6 and 7, a circuit diagram similar to FIG. 2 showing an alternate embodiment transconductance amplifier having a fixed transconductance set by fixed resistor 98, and a circuit diagram similar to FIG. 3 showing an alternate embodiment resistance circuit using a pair of fixed resistors 94 and 96, respectively, may be seen. These circuits do not have the variable gain characteristics of the preferred embodiment, though do exhibit the speed, expandability, etc. of the preferred embodiment. Also, the resulting transconductance amplifier of FIG. 6 utilizing a fixed resistor can be shown to be free of all first order distortion. In some applications, devices other than resistive devices may be used in either or both the transconductance amplifier and the load device, such as by way of example, reactive or complex conductance devices and networks. In the appended claims, the phrase conductance device means any device, resistive or otherwise, including complex networks, reactive devices such as capacitors and inductors, and active circuits and networks simulating the same.

Figure 8:
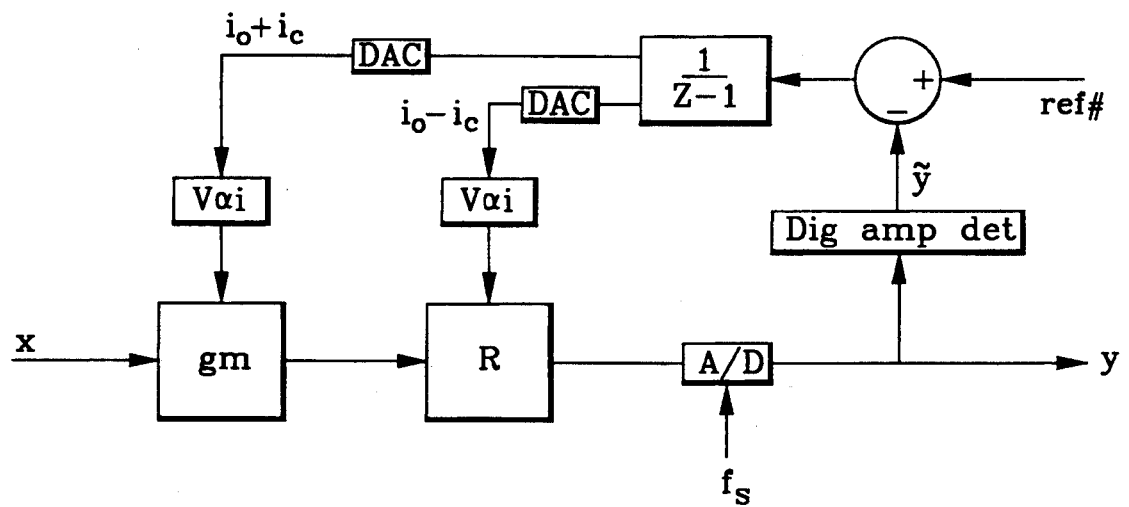
FIG. 8 is a diagram similar to the automatic gain control circuit of FIG. 4, but realized in a partially digital circuit.

In one embodiment of the present invention, the automatic gain control circuit of FIG. 4 is realized in a partially digital circuit as illustrated in FIG. 8. In particular, the gm and R stages are linear stages as hereinbefore described with respect to FIGS. 2 and 3, but with the output of the R stage being converted to digital form by an analog-to-digital (A/D) converter operating at the sampling frequency $f_s$. Feedback is accomplished by comparing the output of a digital amplitude detector with a reference number, and providing the difference between the two to a digital integrator, with the output thereof being converted back to analog form by digital-to-analog converters (DAC) for feedback purposes. In the specific digital-to-analog converters used, the digital input thereto is used to control a plurality of current sources, so that the output of the digital-to-analog converters are the components $i_o+i_c$ and $i_o-i_c$ to control the transconductance and resistance stages, respectively. In this embodiment, the control currents are converted to control voltages proportional to the control currents by a linear resistance element.

Figure 9:
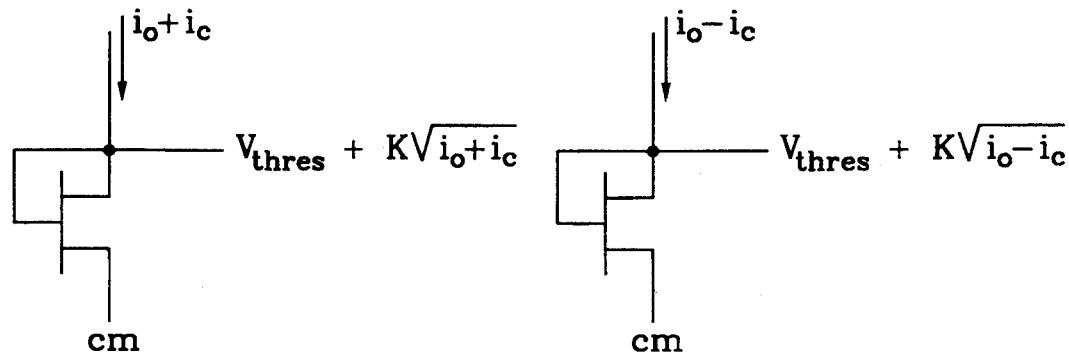
FIGS. 9 and 10 illustrate current to voltage converting elements in the form of diode connected MOS transistors used in the feedback loop of an alternate form of automatic gain control circuit illustrated in FIG. 11.
Figure 10:
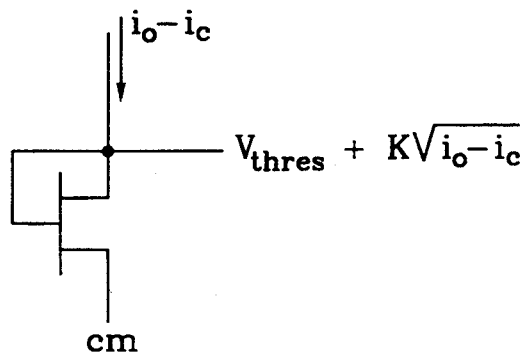
Figure 11:
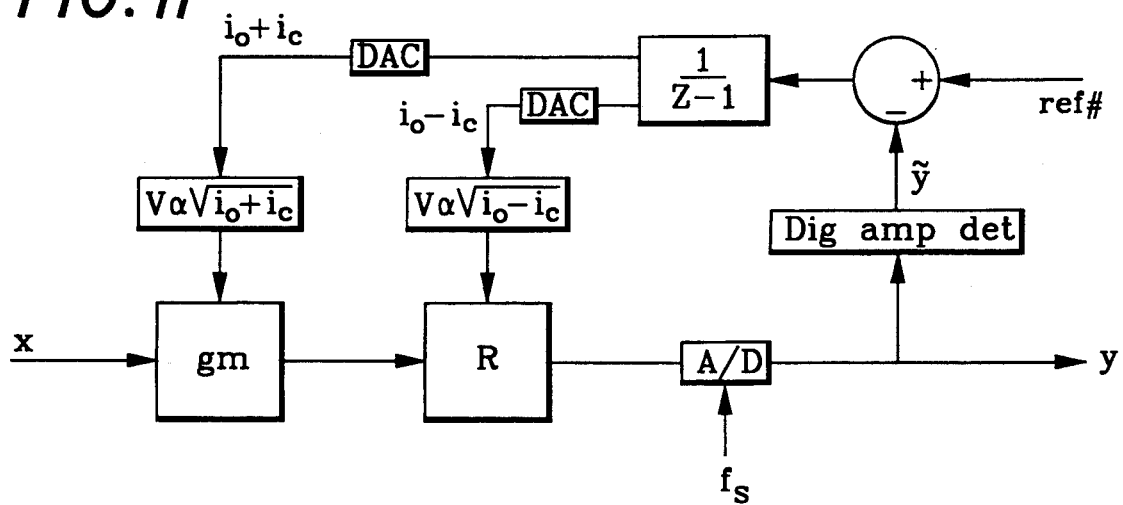
FIG. 11 illustrates an alternate form of automatic gain control circuit utilizing current to voltage converting elements in the form of diode connected MOS transistors in the feedback loop.

In another embodiment (actually another operating mode of the system incorporating the embodiment of FIG. 8), the basic circuit of FIG. 8 is used, though the linear current to voltage converting elements are replaced by diode connected MOS transistors as shown in FIGS. 9 and 10. These two figures illustrate identical transistors, though also illustrate the current to voltage conversions for the two components of currents there through. In each case, the MOS transistors act as a square law device above the threshold voltage, whereby any current through the device will drive the gate-source voltage to the threshold voltage plus an increment of voltage proportional to the square root of the current there through. Stated oppositely, the amount the gate-source voltage exceeds the threshold voltage is proportional to the square root of the current through the MOS transistor. In FIGS. 9 and 10, the sources of the transistors are shown connected to the common mode voltage cm (see also FIG. 3) so that the threshold of the devices matches the threshold of the devices controlled by the control voltage. Also in FIGS. 9 and 10, the constant K is a constant of the conversion dependent upon the various parameters of the MOS transistors, which may be substantially identical for the two devices. Thus, in the automatic gain control circuit of FIG. 11, the feedback is not of the differential currents $i_o+i_c$ and $i_o-i_c$ but rather of voltages which are proportional to the square root of these two current components. However, note that if one has an exponential response to an input, then the response to the square root of the same input will also be exponential. Similarly, if one has a response to an input which approximates an exponential response, then the response to the square root of that input will also approximate an exponential response.

The foregoing may be illustrated by noting the equation for gain of the present invention as hereinbefore set forth.

$$G = \frac{K_o}{K_r} \frac{V_{ong}}{V_{onr}} = \frac{K_o}{K_r} \frac{V_o + V_c}{V_o - V_c} \approx \frac{K_o}{K_r} e^{2(\frac{V_c}{V_o})}$$

or $$\frac{V_o + V_c}{V_o - V_c} \approx e^{2(\frac{V_c}{V_o})}$$

But mathematically, if $$\frac{V_o + V_c}{V_o - V_c} \approx e^{2(\frac{V_c}{V_o})}$$

then

-continued $$\frac{\sqrt{V_o + V_c}}{\sqrt{V_o - V_c}} = \sqrt{\frac{V_o + V_c}{V_o - V_c}} \approx \sqrt{e^{2(\frac{V_c}{V_d})}} =$$

$$e^{(\frac{1}{2})2(\frac{V_c}{V_d})} = e^{(\frac{V_c}{V_d})}$$

changing variables by substituting $i_o$ for $V_o$ and $i_c$ for $V_c$:

$$\frac{\sqrt{i_o + i_c}}{\sqrt{i_o - i_c}} \approx e^{(\frac{i_c}{i_o})}$$

Consequently the desired approximation of an exponential response is obtained regardless of whether the gain may be expressed as a function of an intermediate value plus a control input divided by the intermediate value minus the control input, or the square root thereof, or for that matter any power thereof greater or less than 1.

While preferred and alternate embodiments of the present invention have been disclosed and described in detail herein, it will be obvious to those skilled in the art that various changes in form and detail may be made therein without departing from the spirit and scope thereof.

I claim:

1. A transconductance amplifier comprising:
   first, second, third, fourth, fifth and sixth MOS devices each having a source, a drain and a gate;
   a conductance having first and second conductance connections;
   the source of the first MOS device being coupled to the drain of the third MOS device and to the first conductance connection, and the source of the second MOS device being coupled to the drain of the fourth MOS device and to the second conductance connection;
   the sources of the third and fourth MOS device being coupled to a reference voltage;
   the gates of the first and second MOS devices being coupled to form the differential inputs of the transconductance amplifier;
   first and second current sources being coupled to the drains of the first and second MOS devices to maintain substantially constant current through each of the first and second MOS devices;
   circuitry coupled to the drains of the first and second MOS devices and to the gates of the third and fourth MOS devices respectively to bias the gates of the third and fourth MOS devices so that the current through the third MOS device is equal to the current of the first current source increased or decreased by the current through the conductance device, and the current through the fourth MOS device is equal to the current of the second current source decreased or increased by the current through the conductance device, the current through the third MOS device and the current through the fourth MOS device differing by an amount responsive to the current through the conductance device;
   fifth and sixth MOS devices having their gates coupled to the gates of the third and fourth MOS devices respectively, and their sources coupled to the reference voltage to mirror the current in the third and fourth MOS devices respectively, to a circuit coupled to the transconductance amplifier output.

2. The transconductance amplifier of claim 1 wherein the first, second, third, fourth, fifth and sixth MOS devices are all n-channel MOS devices.

3. The transconductance amplifier of claim 2 wherein the reference voltage is a circuit ground.

4. The transconductance amplifier of claim 1 or 2 wherein the circuitry coupled to the gates of the third and fourth MOS devices to bias the gates of the third and fourth MOS devices comprises third and fourth current sources and seventh and eighth MOS devices each having a source, a drain and a gate; the seventh and eighth MOS devices having their drains coupled to a second reference voltage, their gates coupled to the drains of the first and second MOS devices, respectively, and their sources coupled to the gates of the third and fourth MOS devices, respectively, and to the third and fourth current sources, respectively.

5. The transconductance amplifier of claim 4 wherein the seventh and eighth MOS devices have their drains coupled to the second reference voltage through MOS device switches to provide a circuit power down capability.

6. The transconductance amplifier of claims 1 or 2 wherein the conductance is a MOS device.

7. The transconductance amplifier of claim 6 wherein the conductance is an n-channel MOS device.

8. The transconductance amplifier of claims 1 or 2 wherein the conductance is a resistor.

9. A variable gain amplifier comprising:
   a transconductance amplifier having a current output responsive to a voltage input, the ratio of the current output to the voltage input being approximately proportional to a first control voltage;
   a second circuit having a current input coupled to the current output of the transconductance amplifier and a voltage output, the ratio of the voltage output to the current input of the second circuit being approximately inversely proportional to a second control voltage;
   circuitry responsive to a gain control voltage for providing as the first control voltage a signal raised to a power, which signal approximately linearly increases or decreases with the gain control voltage, and for providing as the second control voltage a signal raised to the same power, which signal approximately linearly decreases or increases with the gain control voltage,
   the variable gain amplifier providing an approximately exponential gain variation with gain control voltage in response to the gain control voltage.

10. The variable gain amplifier of claim 9 wherein the first and second control voltages are signals raised to a power of one.

11. The variable gain amplifier of claim 9 wherein the first and second control voltages are signals raised to a power of one half.

12. The variable gain amplifier of claim 9 wherein both the transconductance amplifier and the second circuit are CMOS circuits.

13. An automatic gain control loop comprising:
   a transconductance amplifier having a current output responsive to a voltage input, the ratio of the current output to the voltage input being approximately proportional to a first control voltage;

second circuit means having a current input coupled to the current output of the transconductance amplifier and a voltage output, the ratio of the voltage output to the current input of the second circuit means being approximately inversely proportional to a second control voltage;

amplitude detection means for providing an output responsive to the output voltage of the second circuit means;

comparison means for providing an output responsive to the difference between a reference voltage and the output of the amplitude detection means;

an integration means for providing an output responsive to the time integration of the output of the comparison means; and means responsive to the output of the integration means for providing as the first control voltage a signal raised to a power, which signal approximately linearly increases with the output of the integration means, and for providing as the second control voltage a signal raised to the same power, which signal approximately linearly decreases with the output of the integration means;

the transconductance amplifier and the second circuit means providing an approximately exponential gain variation in response to the output of the integration means.

14. The variable gain amplifier of claim 13 wherein the first and second control voltages are signals raised to a power of one.

15. The variable gain amplifier of claim 13 wherein the first and second control voltages are signals raised to a power of one half.

16. The variable gain amplifier of claim 13 wherein both the transconductance amplifier and the second circuit are CMOS circuits.

17. A method of providing a variable gain amplifier having an approximate exponential gain variation with variation in a gain control voltage comprising:

providing a transconductance amplifier having a current output responsive to a voltage input, the ratio of the current output to the voltage input being approximately proportional to a first control voltage;

providing a second circuit having a current input coupled to the current output of the transconductance amplifier and a voltage output, the ratio of the voltage output to the current input of the second circuit being approximately inversely proportional to a second control voltage;

providing as a gain control voltage, the first control voltage to the transconductance amplifier which approximately linearly increases with the gain control voltage, and providing the second control voltage to the second circuit which approximately linearly decreases with the gain control voltage, the variable gain amplifier providing an approximately exponential gain variation with gain control voltage in response to the gain control voltage.

18. The method of providing a variable gain amplifier of claim 17 wherein the step of providing a transconductance amplifier further comprises the step of providing a CMOS transconductance amplifier and wherein the step of providing a second circuit comprises the step of providing a CMOS second circuit.

19. A method of providing a gain control loop comprising:

providing a transconductance amplifier having a current output responsive to a voltage input, the ratio of the current output to the voltage input being approximately proportional to a first control voltage;

providing a second circuit means having a current input coupled to the current output of the transconductance amplifier and a voltage output, the ratio of the voltage output to the current input of the second circuit means being approximately inversely proportional to a second control voltage;

comparing a reference voltage and the output voltage of the second circuit means;

integrating the result of the comparison; and providing as the first control voltage a voltage which approximately linearly increases with the result of the integration and providing as the second control voltage a voltage which approximately linearly decreases with the result of the integration, the transconductance amplifier and the second circuit means providing an approximately exponential gain variation in response to the result of the integration.

20. The method of providing a gain control loop of claim 19 wherein the step of providing a transconductance amplifier comprises the step of providing a CMOS transconductance amplifier and wherein the step of providing a second circuit comprises the step of providing a CMOS second circuit.

21. A method of providing a variable gain amplifier having an approximate exponential gain variation with variation in a gain control voltage comprising:

providing a transconductance amplifier having a current output responsive to a voltage input, the ratio of the current output to the voltage input being approximately proportional to a first control voltage;

providing a second circuit having a current input coupled to the current output of the transconductance amplifier and a voltage output, the ratio of the voltage output to the current input of the second circuit being approximately inversely proportional to a second control voltage;

providing as a gain control voltage, a first control voltage to the transconductance amplifier which is approximately the square root of a signal which linearly increases with the gain control voltage, and providing a second control voltage to the second circuit which is approximately the square root of a signal which linearly decreases with the gain control voltage, the variable gain amplifier providing an approximately exponential gain variation with gain control voltage in response to the gain control voltage.

22. The method of providing a variable gain amplifier of claim 21 wherein the step of providing a transconductance amplifier comprises the step of providing a CMOS transconductance amplifier and wherein the step of providing a second circuit comprises the step of providing a CMOS second circuit.

23. A method of providing a gain control loop comprising:

providing a transconductance amplifier having a current output responsive to a voltage input, the ratio of the current output to the voltage input being approximately proportional to a first control voltage;

providing a second circuit means having a current input coupled to the current output of the transconductance amplifier and a voltage output, the ratio of the voltage output to the current input of the second circuit means being approximately inversely proportional to a second control voltage;

comparing a reference voltage and the output voltage of the second circuit means;

integrating the result of the comparison; and providing as the first control voltage a voltage which is approximately the square root of a signal which linearly increases with the result of the integration and providing as the second control voltage a voltage which is approximately the square root of a signal which linearly decreases with the result of the integration, the transconductance amplifier and the second circuit means providing an approximately exponential gain variation in response to the result of the integration.

24. The method of providing a gain control loop of claim 23 wherein the step of providing a transconductance amplifier comprises the step of providing a CMOS transconductance-amplifier and wherein the step of providing a second circuit comprises the step of providing a CMOS second circuit.

* * * * *